(12) United States Patent
Padhi et al.

(10) Patent No.: US 7,867,578 B2
(45) Date of Patent: Jan. 11, 2011

(54) METHOD FOR DEPOSITING AN AMORPHOUS CARBON FILM WITH IMPROVED DENSITY AND STEP COVERAGE

(75) Inventors: Deenesh Padhi, Sunnyvale, CA (US); Hyoung-Chan Ha, San Jose, CA (US); Sudha Rathi, San Jose, CA (US); Derek R. Witty, Fremont, CA (US); Chiu Chan, Foster City, CA (US); Sohyun Park, Santa Clara, CA (US); Ganesh Balasubramanian, Sunnyvale, CA (US); Karthik Janakiraman, San Jose, CA (US); Martin Jay Seamons, San Jose, CA (US); Visweswaren Sivaramakrishnan, Cupertino, CA (US); Bok Hoen Kim, San Jose, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 727 days.

(21) Appl. No.: 11/427,324

(22) Filed: Jun. 28, 2006

(65) Prior Publication Data

US 2008/0003824 A1 Jan. 3, 2008

(51) Int. Cl.
*H05H 1/24* (2006.01)
(52) U.S. Cl. ...................... 427/569; 427/331
(58) Field of Classification Search .................. 427/569
See application file for complete search history.

(56) References Cited

U.S. PATENT DOCUMENTS

| 6,428,894 B1 | 8/2002 | Babich et al. |
| 6,573,030 B1 | 6/2003 | Fairbairn et al. |
| 2003/0091938 A1* | 5/2003 | Fairbairn et al. ............ 430/314 |
| 2005/0059262 A1* | 3/2005 | Yin et al. ..................... 438/780 |
| 2005/0101154 A1* | 5/2005 | Huang ......................... 438/758 |
| 2005/0142361 A1* | 6/2005 | Nakanishi et al. ........... 428/408 |
| 2005/0199013 A1 | 9/2005 | Vandroux et al. |
| 2005/0287771 A1 | 12/2005 | Seamons et al. |
| 2006/0014397 A1* | 1/2006 | Seamons et al. ............ 438/778 |
| 2008/0153311 A1 | 6/2008 | Padhi et al. |

OTHER PUBLICATIONS

Office Action dated Sep. 26, 2008 for Korean Patent Application No. 10-2007-0064292.
Notice to File a Response in Korean Patent Application No. 10-2007-0064292 dated Apr. 17, 2009.
PCT Search Report and Written Opinion for International Application No. PCT/US2009/035726 dated Aug. 25, 2009.
Notice of Final Rejection for Korean Patent Application No. 10-2007-0064292 dated Dec. 31, 2009.

* cited by examiner

*Primary Examiner*—Timothy H Meeks
*Assistant Examiner*—Elizabeth Burkhart
(74) *Attorney, Agent, or Firm*—Patterson & Sheridan, LLP

(57) ABSTRACT

A method for depositing an amorphous carbon layer on a substrate includes the steps of positioning a substrate in a chamber, introducing a hydrocarbon source into the processing chamber, introducing a heavy noble gas into the processing chamber, and generating a plasma in the processing chamber. The heavy noble gas is selected from the group consisting of argon, krypton, xenon, and combinations thereof and the molar flow rate of the noble gas is greater than the molar flow rate of the hydrocarbon source. A post-deposition termination step may be included, wherein the flow of the hydrocarbon source and the noble gas is stopped and a plasma is maintained in the chamber for a period of time to remove particles therefrom.

14 Claims, 6 Drawing Sheets

METHOD FOR DEPOSITING AN AMORPHOUS CARBON FILM WITH IMPROVED DENSITY AND STEP COVERAGE

BACKGROUND OF THE INVENTION

1. Field of the Invention

Embodiments of the present invention generally relate to the fabrication of integrated circuits and particularly to the deposition of an amorphous carbon layer on a semiconductor substrate.

2. Description of the Related Art

Integrated circuits have evolved into complex devices that can include millions of transistors, capacitors and resistors on a single chip. The evolution of chip design continually requires faster circuitry and greater circuit density. The demand for faster circuits with greater circuit densities imposes corresponding demands on the materials used to fabricate such integrated circuits. In particular, as the dimensions of integrated circuit components are reduced to submicron dimensions, it has been necessary to use not only low resistivity conductive materials such as copper to improve the electrical performance of devices, but also low dielectric constant insulating materials, often referred to as low-k materials. Low-k materials generally have a dielectric constant of less than 4.0.

Producing devices having low-k materials with little or no surface defects or feature deformation is problematic. Low-k dielectric materials are often porous and susceptible to being scratched or damaged during subsequent process steps, thus increasing the likelihood of defects being formed on the substrate surface. Low-k materials are often brittle and may deform under conventional polishing processes, such as chemical mechanical polishing (CMP). One solution to limiting or reducing surface defects and deformation of low-k materials is the deposition of a hardmask over the exposed low-k materials prior to patterning and etching. The hardmask prevents damage and deformation of the delicate low-k materials. In addition, a hardmask layer may act as an etch mask in conjunction with conventional lithographic techniques to prevent the removal of a low-k material during etch.

Typically, the hardmask is an intermediate oxide layer, e.g., silicon dioxide or silicon nitride. However, some device structures already include silicon dioxide and/or silicon nitride layers, for example, damascene structures. Such device structures, therefore, cannot be patterned using a silicon dioxide or silicon nitride hardmask as an etch mask, since there will be little or no etch selectivity between the hardmask and the material thereunder, i.e., removal of the hardmask will result in unacceptable damage to underlying layers. To act as an etch mask for oxide layers, such as silicon dioxide or silicon nitride, a material must have good etch selectivity relative to those oxide layers. Amorphous hydrogenated carbon is a material used as a hardmask for silicon dioxide or silicon nitride materials.

Amorphous hydrogenated carbon, also referred to as amorphous carbon and denoted a-C:H, is essentially a carbon material with no long-range crystalline order which may contain a substantial hydrogen content, for example on the order of about 10 to 45 atomic %. a-C:H is used as hardmask material in semiconductor applications because of its chemical inertness, optical transparency, and good mechanical properties. While a-C:H films can be deposited via various techniques, plasma enhanced chemical vapor deposition (PECVD) is widely used due to cost efficiency and film property tunability. In a typical PECVD process, a hydrocarbon source, such as a gas-phase hydrocarbon or vapors of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH— radicals. The excited CH— radicals are chemically bound to the surface of a substrate positioned in the chamber, forming the desired a-C:H film thereon.

FIGS. 1A-1E illustrate schematic cross-sectional views of a substrate 100 at different stages of an integrated circuit fabrication sequence incorporating an a-C:H layer as a hardmask. A substrate structure 150 denotes the substrate 100 together with other material layers formed on the substrate 100. FIG. 1A illustrates a cross-sectional view of a substrate structure 150 having a material layer 102 that has been conventionally formed thereon. The material layer 102 may be a low-k material and/or an oxide, e.g., $SiO_2$.

FIG. 1B depicts an amorphous carbon layer 104 deposited on the substrate structure 150 of FIG. 1A. The amorphous carbon layer 104 is formed on the substrate structure 150 by conventional means, such as via PECVD. The thickness of amorphous carbon layer 104 is variable depending on the specific stage of processing. Typically, amorphous carbon layer 104 has a thickness in the range of about 500 Å to about 10000 Å. Depending on the etch chemistry of the energy sensitive resist material 108 used in the fabrication sequence, an optional capping layer (not shown) may be formed on amorphous carbon layer 104 prior to the formation of energy sensitive resist material 108. The optional capping layer functions as a mask for the amorphous carbon layer 104 when the pattern is transferred therein and protects amorphous carbon layer 104 from energy sensitive resist material 108.

As depicted in FIG. 1B, energy sensitive resist material 108 is formed on amorphous carbon layer 104. The layer of energy sensitive resist material 108 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm.

A pattern is introduced into the layer of energy sensitive resist material 108 by exposing energy sensitive resist material 108 to UV radiation 130 through a patterning device, such as a mask 110, and subsequently developing energy sensitive resist material 108 in an appropriate developer. After energy sensitive resist material 108 has been developed, the desired pattern, consisting of apertures 140, is present in energy sensitive resist material 108, as shown in FIG. 1C.

Thereafter, referring to FIG. 1D, the pattern defined in energy sensitive resist material 108 is transferred through amorphous carbon layer 104 using the energy sensitive resist material 108 as a mask. An appropriate chemical etchant is used that selectively etches amorphous carbon layer 104 over the energy sensitive resist material 108 and the material layer 102, extending apertures 140 to the surface of material layer 102. Appropriate chemical etchants include ozone, oxygen or ammonia plasmas.

Referring to FIG. 1E, the pattern is then transferred through material layer 102 using the amorphous carbon layer 104 as a hardmask. In this process step, an etchant is used that selectively removes material layer 102 over amorphous carbon layer 104, such as a dry etch, i.e. a non-reactive plasma etch. After the material layer 102 is patterned, the amorphous carbon layer 104 can optionally be stripped from the substrate 100. In a specific example of a fabrication sequence, the pattern defined in the a-C:H hardmask is incorporated into the structure of the integrated circuit, such as a damascene structure. Damascene structures are typically used to form metal interconnects on integrated circuits.

Device manufacturers using a-C:H hardmask layers demand two critical requirements to be met: (1) very high selectivity of the hardmask during the dry etching of underlying materials and (2) high optical transparency in the visible spectrum for lithographic registration accuracy. The term "dry etching" generally refers to etching processes wherein a material is not dissolved by immersion in a chemical solution and includes methods such as reactive ion etching, sputter etching, and vapor phase etching. Further, for applications in which a hardmask layer is deposited on a substrate having topographic features, an additional requirement for an a-C:H hardmask is that the hardmask layer conformally covers all surfaces of said topographic features.

Referring back to FIGS. 1A-E, to ensure that amorphous carbon layer 104 adequately protects material layer 102 during dry etching, it is important that amorphous carbon layer 104 possesses a relatively high etch selectivity, or removal rate ratio, with respect to material layer 102. Generally, an etch selectivity during the dry etch process of at least about 10:1 or more is desirable between amorphous carbon layer 104 and material layer 102, i.e., material layer 102 is etched ten times faster than amorphous carbon layer 104. In this way, the hardmask layer formed by amorphous carbon layer 104 protects regions of material layer 102 that are not to be etched or damaged while apertures 140 are formed therein via a dry etch process.

In addition, a hardmask that is highly transparent to optical radiation, i.e., light wavelengths between about 400 nm and about 700 nm, is desirable in some applications, such as the lithographic processing step shown in FIG. 1B. Transparency to a particular wavelength of light allows for more accurate lithographic registration, which in turn allows for very precise alignment of mask 110 with specific locations on substrate 100. The transparency of a material to a given frequency of light is generally quantified as the absorption coefficient of a material, which is also referred to as the extinction coefficient. For example, for an a-C:H layer that is approximately 6000 Å to 7000 Å thick, the a-C:H layer should have an absorption coefficient of 0.12 or less at the frequency of light used for the lithographic registration, for example 630 nm, otherwise mask 110 may not be aligned accurately. Producing a layer with an absorption coefficient of 0.12 or less may be accomplished by modulating deposition parameters, such as substrate temperature or plasma ion energy.

However, there is typically a trade-off between creating an a-C:H film that possesses high transparency and one with high etch selectivity. An amorphous carbon layer with better etch selectivity will generally have worse transparency. For example, when deposition temperature is used as the modulating factor, a-C:H films deposited at relatively high temperatures, i.e. >500° C., typically possess good etch selectivity but low transparency. Lowering the deposition temperature, especially below 400° C., improves the transparency of the a-C:H film but results in a higher etching rate for the film and, hence, less etch selectivity.

As noted above, in some applications, a hardmask layer may be deposited on a substrate with an underlying topography, for example an alignment key used to align the patterning process. In these applications, an a-C:H layer that is highly conformal to the underlying topography is also desirable. FIG. 2 illustrates a schematic cross-sectional view of a substrate 200 with a feature 201 and a non-conformal amorphous carbon layer 202 formed thereon. Because non-conformal amorphous carbon layer 202 does not completely cover the sidewalls 204 of feature 201, subsequent etching processes may result in unwanted erosion of sidewalls 204. The lack of complete coverage of sidewalls 204 by non-conformal amorphous carbon layer 202 may also lead to photoresist poisoning of the material under non-conformal carbon layer 202, which is known to damage electronic devices. Conformality of a layer is typically quantified by a ratio of the average thickness of a layer deposited on the sidewalls of a feature to the average thickness of the same deposited layer on the field, or upper surface, of the substrate.

Further, it is important that the formation of a hardmask layer does not deleteriously affect a semiconductor substrate in other ways. For example, if, during the formation of a hardmask, a large numbers of particles that can contaminate the substrate are generated, or the devices formed on the substrate are excessively heated, the resulting problems can easily outweigh any benefits.

Therefore, there is a need for a method of depositing a material layer useful for integrated circuit fabrication which has good etch selectivity with oxides, has high optical transparency in the visible spectrum, can be conformally deposited on substrates having topographic features, and can be produced at relatively low temperatures without generating large numbers of particles.

SUMMARY OF THE INVENTION

Embodiments of the present invention provide a method for depositing an amorphous carbon layer on a substrate. The method, according to a first embodiment, comprises positioning a substrate in a chamber, introducing a hydrocarbon source into the processing chamber, introducing a heavy noble gas the processing chamber, and generating a plasma in the processing chamber. The heavy noble gas is selected from the group consisting of argon, krypton, xenon, and combinations thereof and the molar flow rate of the noble gas is greater than the molar flow rate of the hydrocarbon source. A post-deposition termination step may be included, wherein the flow of the hydrocarbon source and the noble gas is stopped and a plasma is maintained in the chamber for a period of time to remove particles therefrom. Hydrogen may also be introduced into the chamber during the post-deposition termination step.

A method, according to a second embodiment, comprises positioning a substrate in a chamber, introducing a hydrocarbon source into the processing chamber, introducing a diluent gas of the hydrocarbon source into the processing chamber, and generating a plasma in the processing chamber. The molar flow rate of the diluent gas into the processing chamber is between about 2 times and about 40 times the molar flow rate of the hydrocarbon source. A post-deposition termination step similar to that of the first embodiment may also be included in this method.

The method, according to a third embodiment, comprises positioning a substrate in a chamber, introducing a hydrocarbon source into the processing chamber, introducing a diluent gas of the hydrocarbon source into the processing chamber, generating a plasma in the processing chamber, and maintaining a pressure of about 2 Torr to 8 Torr in the processing chamber after initiating plasma therein. The amorphous carbon layer may have a density of between about 1.2 g/cc and about 1.8 g/cc and the absorption coefficient of the amorphous carbon layer may be less than about 0.10 in the visible spectrum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures.

DETAILED DESCRIPTION

Figure 3:
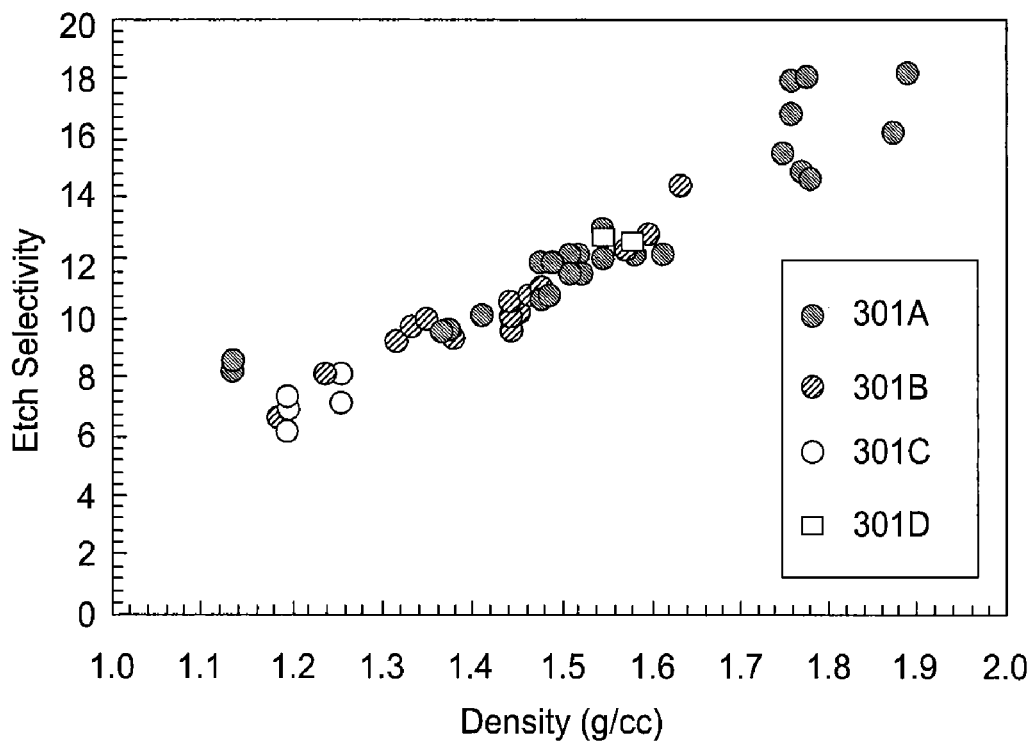
FIG. 3 is a graph plotting the relationship between film density and etch selectivity of amorphous carbon films.

The inventors have learned that there is a strong correlation between a-C:H film density and etch selectivity regardless of the hydrocarbon source used to deposit the a-C:H film. FIG. 3 is a graph plotting the relationship between film density and etch selectivity of multiple samples of four different a-C:H films 301A-D deposited on different substrates. Etch selectivity is the factor by which an underlying material is etched compared to a given a-C:H film, i.e., an etch selectivity of 10 indicates that an underlying material is removed ten times faster than the a-C:H film. Each of films 301A-D were formed from different precursors and processing conditions. The data reveal a substantially linear correlation between the density and etch selectivity of each film regardless of the precursor. These results demonstrate that it is possible to achieve a desired etch selectivity for an a-C:H film by increasing the film density, even though the processing temperatures and precursors are substantially different. Hence, densification of a-C:H films may be one method of improving etch selectivity.

Aspects of the invention contemplate the use of a relatively large flow rate of argon or other heavy noble gas, such as krypton or xenon, as a diluent gas during a-C:H film deposition to increase the resultant film density (and therefore etch selectivity), the deposition rate of the film, and the conformality of the film to features on the surface of the substrate. The application of a heavy noble gas as a large flow rate diluent gas also improves the efficiency of hydrocarbon precursor utilization during the deposition process, minimizing unwanted deposition on interior surfaces of the deposition chamber. Helium has been used as the primary non-reactive component of the working gas in a PECVD chamber for a-C:H film deposition since it is easily ionized and is therefore advantageous for initiating plasma in a chamber with low risk of arcing. Although argon is sometimes used as a carrier gas for introducing a liquid-phase precursor into a PECVD processing chamber, argon has not been used in very high quantities as contemplated by aspects of the invention and, hence, does not provide the benefits thereof when used as a carrier gas.

Exemplary Apparatus

Figure 3A:
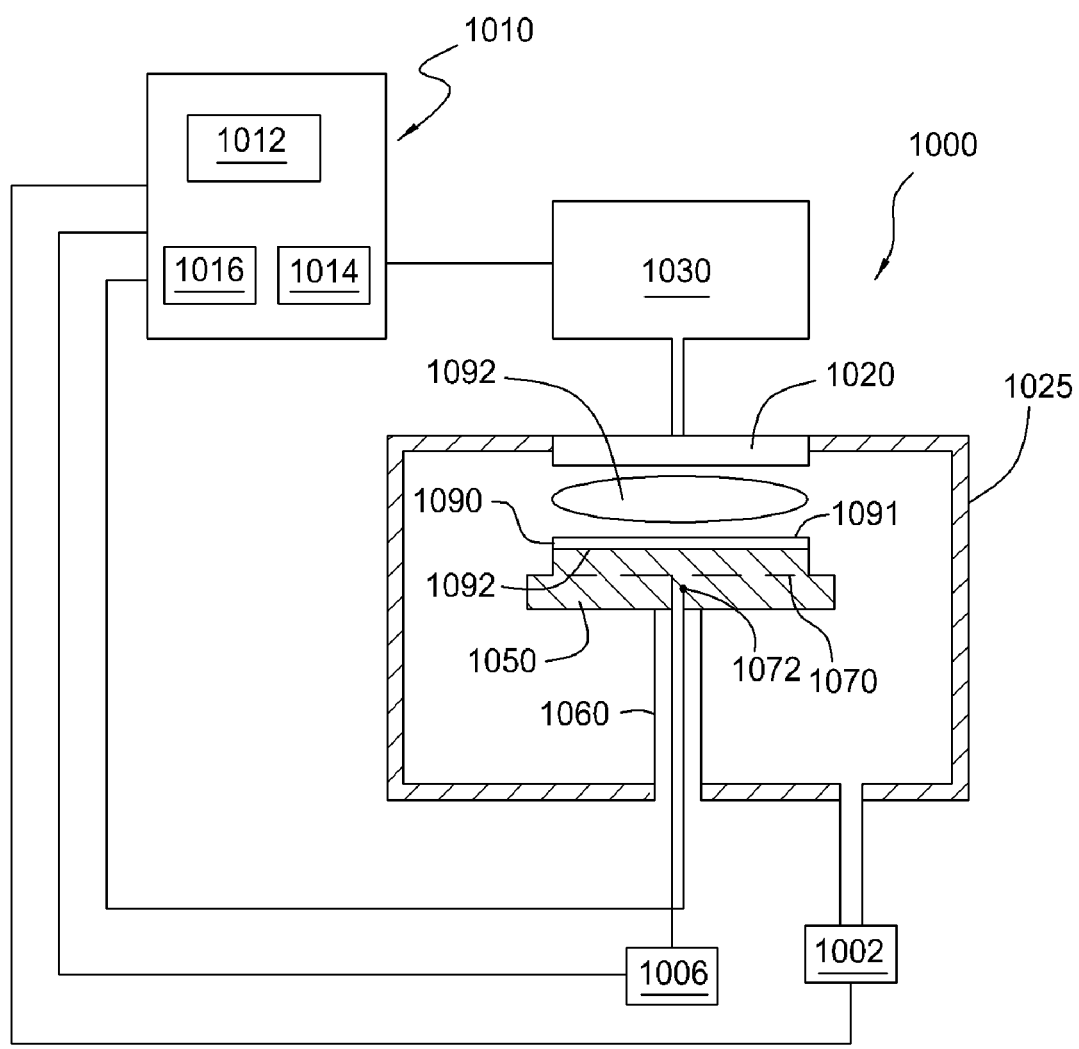
FIG. 3A is a schematic representation of a substrate processing system that can be used to perform amorphous carbon layer deposition according to embodiments of the invention.

FIG. 3A is a schematic representation of a substrate processing system, system 1000, that can be used to perform amorphous carbon layer deposition according to embodiments of the present invention. Examples of suitable systems include the CENTURA® systems which may use a DxZ™ processing chamber, PRECISION 5000® systems, PRODUCER™ systems, and the PRODUCER SE™ processing chambers which are commercially available from Applied Materials, Inc., Santa Clara, Calif.

System 1000 includes a process chamber 1025, a gas panel 1030, a control unit 1010, and other hardware components such as power supplies and vacuum pumps. Details of one embodiment of the system used in the present invention are described in a commonly assigned U.S. patent "High Temperature Chemical Vapor Deposition Chamber", U.S. Pat. No. 6,364,954, issued on Apr. 2, 2002, which is hereby incorporated by reference herein.

The process chamber 1025 generally comprises a substrate support pedestal 1050, which is used to support a substrate such as a semiconductor substrate 1090. This substrate support pedestal 1050 moves in a vertical direction inside the process chamber 1025 using a displacement mechanism (not shown) coupled to shaft 1060. Depending on the process, the semiconductor substrate 1090 can be heated to a desired temperature prior to processing. The substrate support pedestal 1050 is heated by an embedded heater element 1070. For example, the substrate support pedestal 1050 may be resistively heated by applying an electric current from a power supply 1006 to the heater element 1070. The semiconductor substrate 1090 is, in turn, heated by the pedestal 1050. A temperature sensor 1072, such as a thermocouple, is also embedded in the substrate support pedestal 1050 to monitor the temperature of the substrate support pedestal 1050. The measured temperature is used in a feedback loop to control the power supply 1006 for the heater element 1070. The substrate temperature can be maintained or controlled at a temperature that is selected for the particular process application.

A vacuum pump 1002 is used to evacuate the process chamber 1025 and to maintain the proper gas flows and pressure inside the process chamber 1025. A showerhead 1020, through which process gases are introduced into process chamber 1025, is located above the substrate support pedestal 1050 and is adapted to provide a uniform distribution of process gases into process chamber 1025. The showerhead 1020 is connected to a gas panel 1030, which controls and supplies the various process gases used in different steps of the process sequence. Process gases may include a hydrocarbon source and a plasma-initiating gas and are described in more detail below in conjunction with a description of an exemplary argon-diluted deposition process.

The gas panel 1030 may also be used to control and supply various vaporized liquid precursors. While not shown, liquid precursors from a liquid precursor supply may be vaporized, for example, by a liquid injection vaporizer, and delivered to process chamber 1025 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 1020 and substrate support pedestal 1050 may also form a pair of spaced electrodes. When an electric field is generated between these electrodes, the process gases introduced into chamber 1025 are ignited into a plasma 1092. Typically, the electric field is generated by connecting the substrate support pedestal 1050 to a source of single-frequency or dual-frequency radio frequency (RF) power (not shown) through a matching network (not shown). Alternatively, the RF power source and matching network may be coupled to the showerhead 1020, or coupled to both the showerhead 1020 and the substrate support pedestal 1050.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 1030 is performed by mass flow controllers (not shown) and a control unit 1010 such as a computer. The showerhead 1020 allows process gases from the gas panel 1030 to be uniformly distributed and introduced into the process chamber 1025. Illustratively, the control unit 1010 comprises a central processing unit (CPU) 1012, support circuitry 1014, and memories containing associated control software 1016. This control unit 1010 is responsible for automated control of the numerous steps required for substrate processing, such as substrate transport, gas flow control, liquid flow control, temperature control, chamber evacuation, and so on. When the process gas mixture exits the showerhead 1020, plasma enhanced thermal decomposition of the hydrocarbon compound occurs at the surface 1091 of the semiconductor substrate 1090, resulting in the deposition of an amorphous carbon layer on the semiconductor substrate 1090.

Deposition Process

Aspects of the invention contemplate the deposition of an a-C:H layer by a process that includes introducing a hydrocarbon source, a plasma-initiating gas, and a diluent gas into a processing chamber, such as process chamber 1025 described above in conjunction with FIG. 3A. The hydrocarbon source is a mixture of one or more hydrocarbon compounds. The hydrocarbon source may include a gas-phase hydrocarbon compound, preferably $C_3H_6$, and/or a gas mixture including vapors of a liquid-phase hydrocarbon compound and a carrier gas. The plasma-initiating gas is preferably helium, because it is easily ionized, however other gases, such as argon, may also be used. The diluent gas is an easily ionized, relatively massive, and chemically inert gas. Preferred diluent gases include argon, krypton, and xenon. Gases less massive than argon are not preferred due to their inability to achieve the beneficial improvements in film density, throughput, and conformality described below in conjunction with FIGS. 4-9.

Additionally, amorphous carbon layers formed using partially or completely doped derivatives of hydrocarbon compounds may also benefit from the inventive method. Derivatives include nitrogen-, fluorine-, oxygen-, hydroxyl group-, and boron-containing derivatives of hydrocarbon compounds as well as fluorinated derivatives thereof. The hydrocarbon compounds may contain nitrogen or be deposited with a nitrogen-containing gas, such as ammonia, or the hydrocarbon compounds may have substituents such as fluorine and oxygen. Any of these processes may benefit from the density, deposition rate and conformality improvements demonstrated for undoped a-C:H films deposited with the inventive method. A more detailed description of doped derivatives of hydrocarbon compounds and combinations thereof that may be used in processes benefiting from aspects of the invention may be found in commonly assigned United States Pub. No. 2005/0287771 entitled "Liquid Precursors for the CVD deposition of Amorphous Carbon Films," filed on Feb. 24, 2005, which is hereby incorporated by reference in its entirety to the extent not inconsistent with the claimed invention.

Generally, hydrocarbon compounds or derivatives thereof that may be included in the hydrocarbon source may be described by the formula $C_AH_BO_CF_D$, where A has a range of between 1 and 24, B has a range of between 0 and 50, C has a range of 0 to 10, D has a range of 0 to 50, and the sum of B and D is at least 2. Specific examples of suitable hydrocarbon compounds include saturated or unsaturated aliphatic, saturated or unsaturated alicyclic hydrocarbons, and aromatic hydrocarbons.

Aliphatic hydrocarbons include, for example, alkanes such as methane, ethane, propane, butane, pentane, hexane, heptane, octane, nonane, decane, and the like; alkenes such as ethylene, propylene, butylene, pentene, and the like; dienes such as butadiene, isoprene, pentadiene, hexadiene and the like; alkynes such as acetylene, vinylacetylene and the like. Alicyclic hydrocarbons include, for example, cyclopropane, cyclobutane, cyclopentane, cyclopentadiene, toluene, and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3,-tetramethylbutylbenzene, t-butylether, t-butylethylene, methyl-methacrylate, and t-butylfurfurylether may be selected.

Examples of suitable derivatives of hydrocarbon compounds are fluorinated alkanes, halogenated alkanes, and halogenated aromatic compounds. Fluorinated alkanes include, for example, monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes include monofluoroethylene, difluoroethylenes, trifluoroethylene, tetrafluoroethylene, monochloroethylene, dichloroethylenes, trichloroethylene, tetrachloroethylene, and the like. Halogenated aromatic compounds include monofluorobenzene, difluorobenzenes, tetrafluorobenzenes, hexafluorobenzene and the like.

The a-C:H deposition process with argon dilution is a PECVD process. The a-C:H layer may be deposited from the processing gas by maintaining a substrate temperature between about 100° C. and about 450° C. and preferably between about 300° C. and about 450° C. in order to minimize the coefficient of absorption of the resultant film. The process further includes maintaining a chamber pressure between about 2 Torr and about 8 Torr. The hydrocarbon source, a plasma-initiating gas, and a diluent gas are introduced into the chamber and plasma is initiated to begin deposition. Preferably, the plasma-initiating gas is helium or another easily ionized gas and is introduced into the chamber before the hydrocarbon source and the diluent gas, which allows a stable plasma to be formed and reduces the chances of arcing. A preferred hydrocarbon source is $C_3H_6$, although, as described above, other hydrocarbon compounds may be used depending on the desired film, including one or more vaporized liquid-phase hydrocarbon compounds entrained in a carrier gas. The diluent gas may be any noble gas at least as massive as argon, however argon is preferred for reasons of economy. Plasma is generated by applying RF power at a power density to substrate surface area of between about 0.7 W/cm$^2$ and about 3 W/cm$^2$ and preferably about 1.1 to 2.3 W/cm$^2$. Electrode spacing, i.e., the distance between the substrate and the showerhead, is between about 200 mils and about 1000 mils.

A dual-frequency RF system may be used to generate plasma. The dual frequency is believed to provide independent control of flux and ion energy, since the energy of the ions hitting the film surface influences the film density. The high frequency plasma controls plasma density and the low frequency plasma controls kinetic energy of the ions hitting the wafer surface. A dual-frequency source of mixed RF power provides a high frequency power in a range between about 10 MHz and about 30 MHz, for example, about 13.56 MHz, as well as a low frequency power in a range of between about 10 KHz and about 1 MHz, for example, about 350 KHz. When a dual frequency RF system is used to deposit an a-C:H film, the ratio of the second RF power to the total mixed frequency power is preferably less than about 0.6 to 1.0 (0.6: 1). The applied RF power and use of one or more frequencies may be varied based upon the substrate size and the equipment used.

In order to maximize the benefits of the argon-dilution deposition method, it is important that a large quantity of diluent is introduced into the PECVD chamber relative to the quantity of hydrocarbon compounds. However, it is equally important that diluent is not introduced into the chamber at a flow rate that is too high. Higher density a-C:H layers may be formed with increasing diluent flow rates, producing even higher etch selectivity for the a-C:H film, but higher density also leads to higher film stress. Very high film stress in the a-C:H film causes serious problems such as poor adhesion of the a-C:H film to substrate surfaces and/or cracking of the a-C:H film. Therefore, the addition of argon or other diluent beyond a certain molar ratio relative to the hydrocarbon compound will deleteriously affect the properties of the film. Hence, there is a process window, wherein the ratio of molar flow rate of argon diluent to the molar flow rate of hydrocarbon compound into the PECVD chamber is preferably maintained between about 2:1 and about 40:1, depending on the desired properties of the deposited film. For the deposition of some a-C:H films, the most desirable range of this ratio is between about 10:1 and about 14:1.

An exemplary deposition process for processing 300 mm circular substrates employs helium as the plasma-initiating gas, $C_3H_6$ as the hydrocarbon source, and argon as the diluent gas. The flow rate of helium is between about 200 sccm and about 5000 sccm, the flow rate of $C_3H_6$ is between about 300 sccm and 600 sccm, and the flow rate of argon is between about 4000 sccm and about 10000 sccm. Single frequency RF power is between about 800 W and about 1600 W. Intensive parameters for this process, i.e., chamber pressure, substrate temperature, etc., are as described above. These process parameters provide a deposition rate for an a-C:H layer in the range of about 2000 Å/min to about 6000 Å/min, with a density in the range of about 1.2 g/cc and about 1.8 g/cc, and an absorption coefficient of about 0.10 for 633 nm radiation. One skilled in the art, upon reading the disclosure herein, can calculate appropriate process parameters in order to produce an a-C:H film of different density, absorption coefficient, or deposition rate than those discussed herein.

Table 1 summarizes a comparison of two a-C:H films deposited on two respective 300 mm circular substrates. Film 1 was deposited using a conventional, helium-based deposition process that is currently considered the standard process for the semiconductor industry. Film 2 was deposited using one aspect of the invention.

TABLE 1

Comparison of Two Deposition Recipes and Resultant Films

| Parameters | Film 1 | Film 2 |
|---|---|---|
| Substrate Temp. (C.) | 550 | 300 |
| Chamber Pressure (Torr) | 7 | 5 |
| $C_3H_6$ Flow (sccm) | 1800 | 600 |
| He Flow (sccm) | 700 | 400 |
| Argon Flow (sccm) | 0 | 8000 |
| Dep. Rate (Å/min) | 2200 | 4550 |
| Absorption Coefficient @ 633 nm | 0.40 | 0.09 |
| Film Density (g/cc) | 1.40 | 1.42 |
| Conformality (%) | 5 | 20-30 |

Referring to Table 1, Film 2 was deposited at a substantially lower temperature than Film 1 and with flow rate of hydrocarbon compound ⅓ that of Film 1. Despite the lower hydrocarbon flow rate, Film 2 was nonetheless deposited at more than twice the rate of Film 1. Further, the properties of Film 2 are superior to those of Film 1, namely, greatly improved conformality and a very low absorption coefficient. Hence, using the inventive method described herein, amorphous carbon layers may be formed on a substrate surface at a higher deposition rate and having superior film properties to conventional a-C:H layers.

Film Density Enhancement

Figure 4:
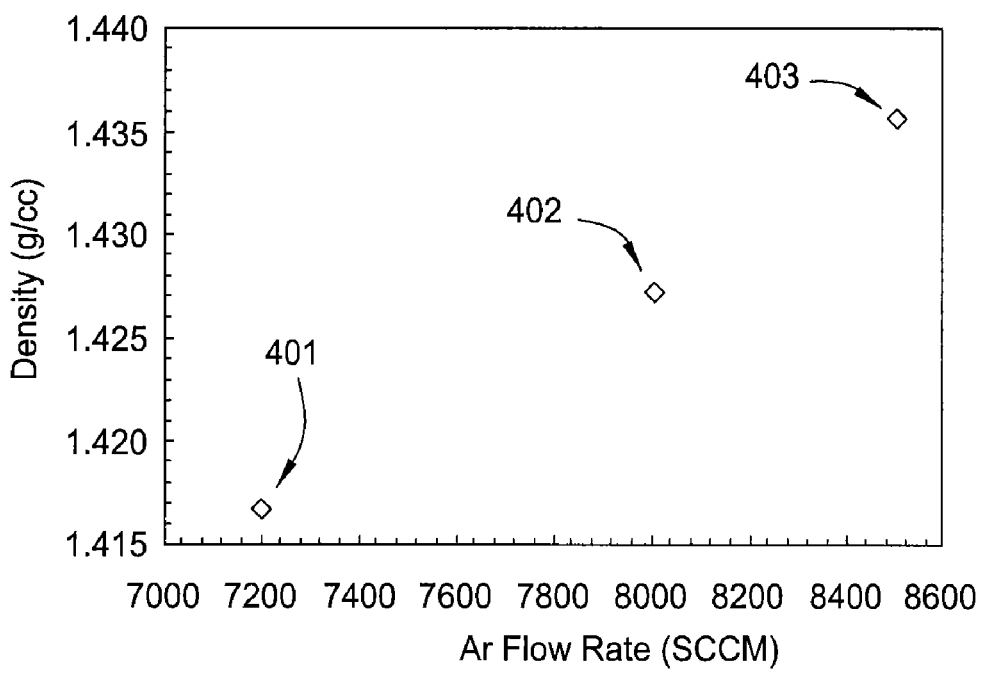
FIG. 4 is a graph demonstrating the effect of an argon diluent gas on amorphous carbon film density.

According to an embodiment of the invention, one important benefit of this method is the ability to increase the density, and therefore dry etch selectivity, of a-C:H films. FIG. 4 is a graph demonstrating the effect of an argon diluent gas on a-C:H film density. Film density for three 300 mm semiconductor substrates 401-403 is illustrated. Processing conditions for all three substrates, including chamber pressure, radio frequency (RF) plasma power, hydrocarbon precursor, and hydrocarbon flow rate, were identical except for the flow rate of argon into the processing chamber during the deposition process. Argon flow rate during deposition on substrate 401 was 7200 standard cubic centimeters per minute (sccm) and was increased to 8000 sccm and 8500 sccm for substrates 402 and 403, respectively. Relative to substrate 401, film density for substrates 402, 403 is increased proportionate to the higher argon flow rates applied during the processing thereof. This indicates that the density of an amorphous carbon film can be increased by the addition of a relatively large flow rate of argon diluent without altering other process variables, such as hydrocarbon precursor flow rate or RF plasma power.

It is important to note that aspects of the inventive method contemplate the use of substantially higher flow rates of argon than are necessary for the initiation of plasma in a PECVD chamber or to act as a carrier gas for a liquid-phase precursor chemical. For example, a typical flow rate of argon into a 300 mm PECVD chamber, when used as a carrier gas for a liquid-phase precursor, is on the order of about 2000 sccm or less.

The flow rate of helium into such a chamber is generally even less. In contrast, the desired flow rate of argon as a diluent gas for increasing the density of an amorphous carbon film is much higher, i.e., greater than about 7000 sccm.

Figure 5:
FIG. 5 illustrates the effect of diluent gas type on resultant film density.

Argon ions, which are approximately ten times as massive as helium ions, are much more effective at bombarding the surface of a substrate during film growth. The more intense bombardment of argon ions during deposition is likely to create many more dangling bonds and chemically active sites where CH— radicals in the plasma can stick to thereby form a denser film. Lighter ions, such as helium ions, are unable to produce similar results due to the lack of momentum associated with their lower mass. FIG. 5 illustrates the effect of diluent gas type on resultant film density. Film density on two substrates 501, 502 is shown. For the deposition of substrate 501, argon was used as the diluent gas. For the deposition of substrate 502, helium was used. Except for diluent gas type, all other process conditions were kept constant. As illustrated in FIG. 5, the a-C:H density is substantially higher for substrate 501 than substrate 502.

It has also been determined that other factors may beneficially increase deposited film density for a-C:H films to thereby increase the dry etch selectivity. These factors include dilution of the hydrocarbon source with a relatively high ratio of diluent gas (not only argon), decreasing the flow rate of the hydrocarbon source, and reducing the processing pressure.

Figure 6:
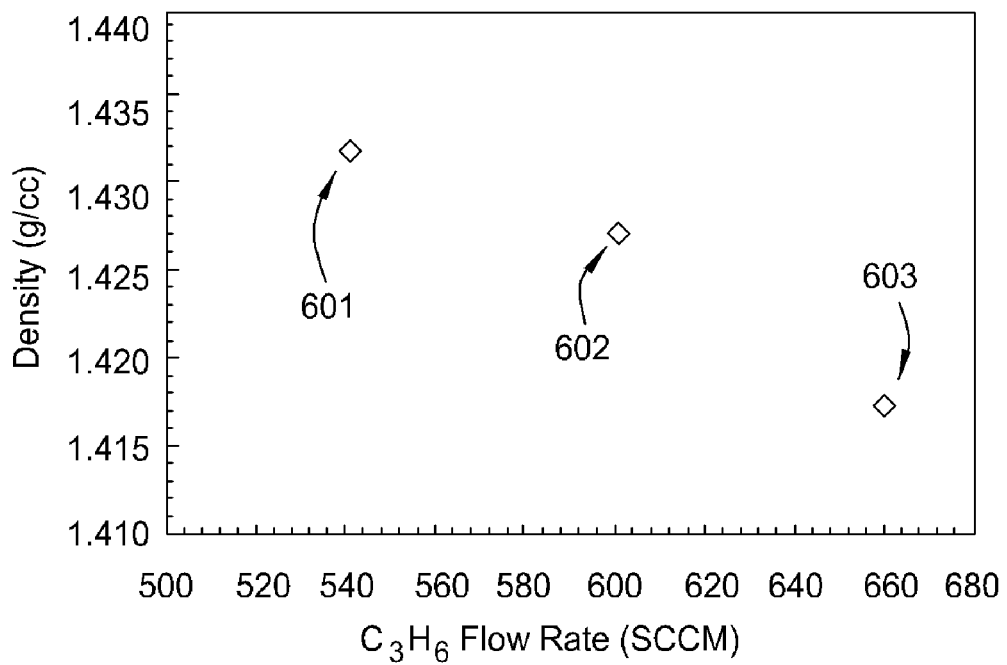
FIG. 6 illustrates the effect of lower hydrocarbon flow rate on film density.

The increased use of diluent gases and/or the reduction of the hydrocarbon source flow rate decreases the deposition rate of the a-C:H film and thereby allows ion bombardment from CVD plasma to be more effective in compacting the growing film. This has been found to be true for a number of diluent gases, including helium and hydrogen, although these two gases do not have the additional densification capability of argon and heavier noble gases, as described above in conjunction with FIG. 4. The effect of lower hydrocarbon flow rate on film density is illustrated in FIG. 6, wherein a different flow rate of $C_3H_6$ is used for the deposition of an a-C:H film on three different substrates 601-603, respectively. Film density is shown to decrease with increasing $C_3H_6$ flow rate due to higher deposition rate and the corresponding lack of compaction of the film during deposition. Hence, the film on substrate 603 has the lowest density and the highest $C_3H_6$ flow rate during deposition.

Figure 7:
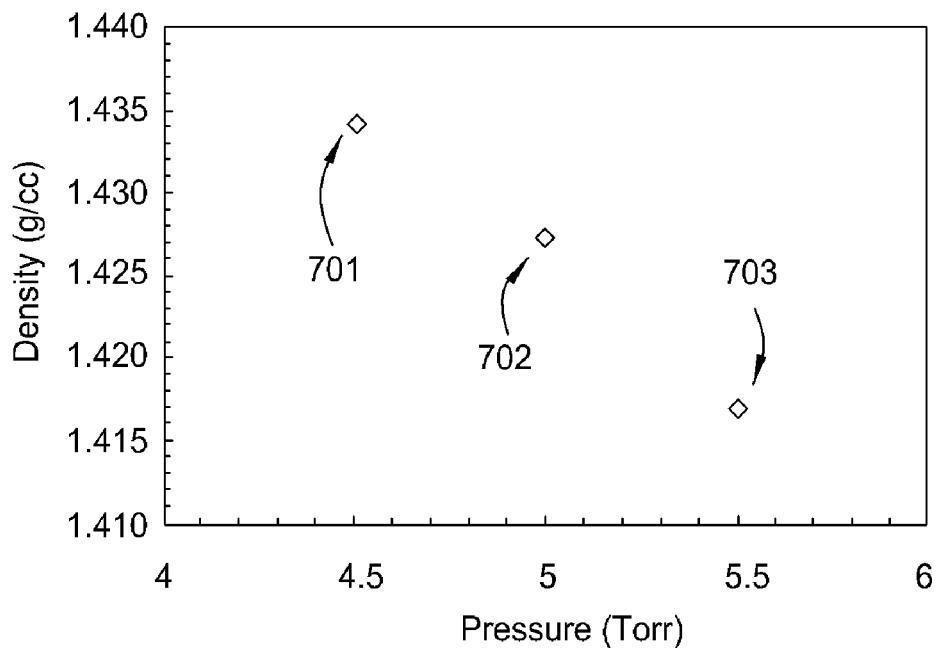
FIG. 7 illustrates the effect of chamber pressure on film density.

In addition to the ratio of diluent gas to hydrocarbon source, chamber pressure also has a substantial effect on the film density. Because the ion energy in a plasma is directly proportional to the sheath voltage, and the sheath voltage across a substrate increases with decreasing pressure, film density can be expected to increase with decreasing pressure. This is illustrated in FIG. 7, wherein a different process pressure is used for the deposition of an a-C:H film on three different substrates 701-703, respectively. Film density is shown to decrease with increasing process pressure, due to the more energetic ions found in a lower pressure plasma.

Deposition Rate Improvement

Another advantage of the inventive method is a significant improvement on deposition rate of a-C:H films. Ordinarily, a trade-off exists between film density and deposition rate; with a standard, i.e., helium-based, deposition process, deposition parameters may be tuned to produce a higher density a-C:H film, but only by reducing throughput significantly. For example, as described above in conjunction with FIG. 6, a higher density a-C:H film is deposited when the flow rate of hydrocarbon precursor is reduced, but deposition rate is also correspondingly reduced. So although the resultant film may have a desired density, such a deposition process may not be commercially viable due to the restrictively long process time required to deposit such a film on a substrate.

The inventive method allows for both a high density film and a relatively high deposition rate of such a film. Compared to a standard a helium-based PECVD process, the deposition rate of a-C:H films is greatly increased when argon is used as a diluent gas in large quantities. As described above in conjunction with FIG. 6, the dilution of the hydrocarbon source results in a higher density film and a lower deposition rate. Besides increasing film density, the addition of argon raises the deposition rate significantly.

Figure 8:
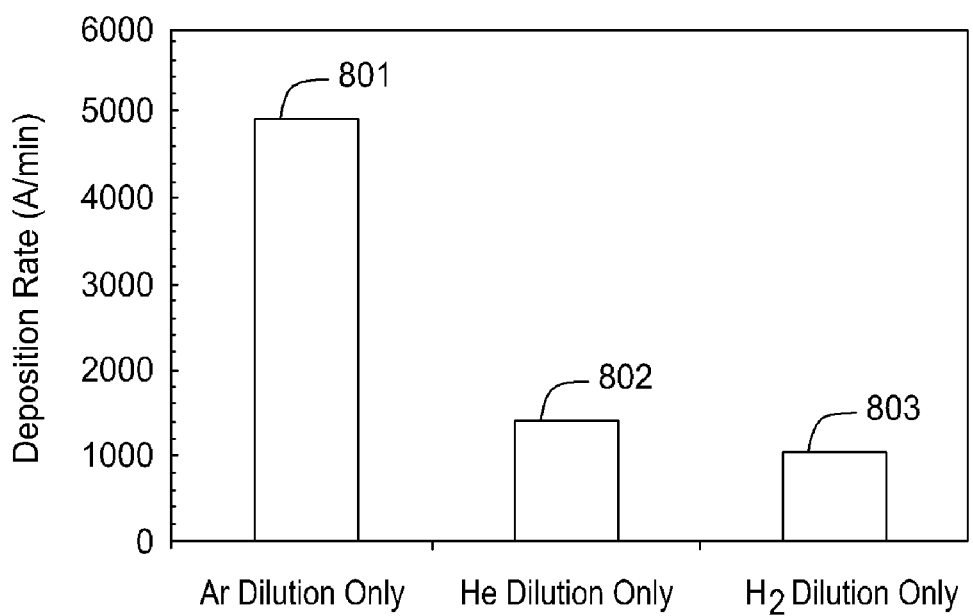
FIG. 8 illustrates the deposition rate improvement by introducing a heavy noble gas as a high flow rate diluent while depositing an amorphous carbon film.

FIG. 8 illustrates the deposition rate improvement afforded by the introduction of a heavy noble gas, e.g., argon, as a high flow rate diluent during the process of depositing an a-C:H film. The deposition rates of three diluent gases are compared on three different substrates 801-803, respectively, wherein the diluent gas flow rate was held constant at 8000 sccm for all three substrates. Argon dilution was used for the deposition of substrate 801, helium for substrate 802, and hydrogen for substrate 803. All other process conditions were identical for all three substrates. Argon dilution produces a more than three-fold increase in the deposition rate compared to He or $H_2$ dilution. As described above in conjunction with FIGS. 4 and 5, the easily ionized—but much more massive—argon atoms are able to create more reactive sites on the surface of an a-C:H film by breaking the C—H bonds thereon, increasing the probability of incoming radicals sticking to the film surface. In addition, the large flow rate of an easily ionized gas, e.g., argon, may give rise to higher plasma density and therefore, more —$CH_x$ radical creation in the gas phase. Together, the more reactive plasma and more reactive film surface associated with argon dilution lead to the beneficial combination of high deposition rate and high film density.

Furthermore, the combination of more —$CH_x$ radicals present in the plasma and more reactive sites on the surface of the film due to argon dilution also explains the substantial improvement in chemistry utilization observed with the argon-diluted process. Rather than depositing on all interior surfaces of the PECVD chamber as unwanted hydrocarbon residue, the majority of hydrocarbon material is efficiently deposited on the substrate surface in the argon-dilution process. This preferential deposition onto the substrate translates into a major productivity gain. The chamber clean time for the argon-diluted process is much shorter compared to a helium- or hydrogen-diluted process due to the reduced residue build-up in the PECVD chamber. Shorter clean time increases throughput of the PECVD chamber since less time is dedicated to cleaning the chamber between the processing of substrates. Further, particle contamination of substrates resulting from hydrocarbon residue flaking off interior surfaces of the PECVD chamber is also greatly reduced by the improvement in chemistry utilization of the argon-diluted process; less residue build-up inside the PECVD chamber equates to less particle contamination of substrates processed therein.

Conformality Improvement

Figure 1A:
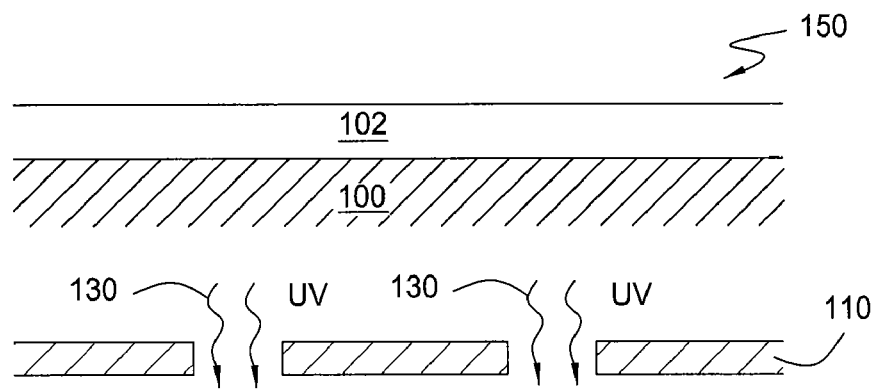
FIGS. 1A-1E (Prior Art) illustrate schematic cross-sectional views of a substrate at different stages of an integrated circuit fabrication sequence incorporating an amorphous carbon layer as a hardmask.
Figure 1B:
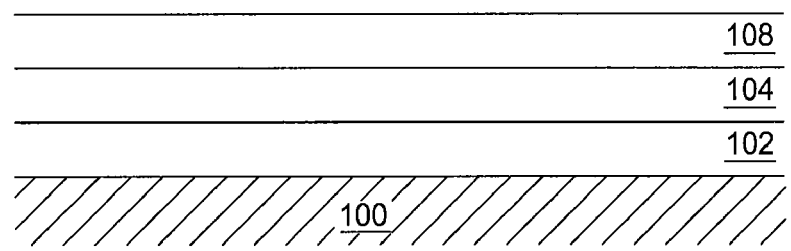
Figure 1C:
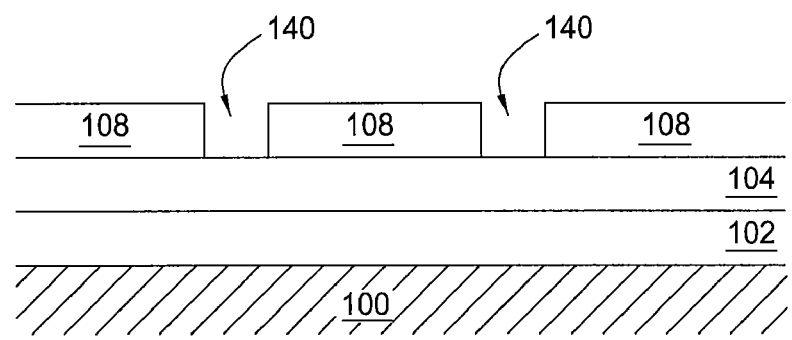
Figure 1D:
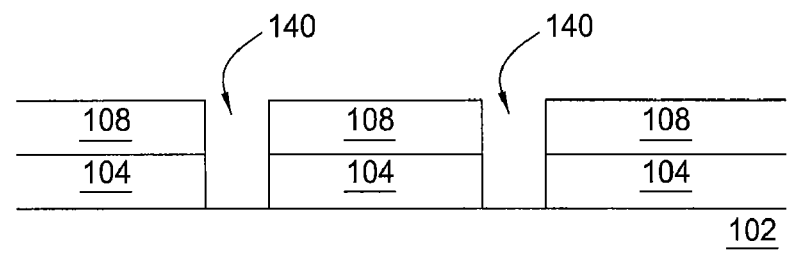
Figure 1E:
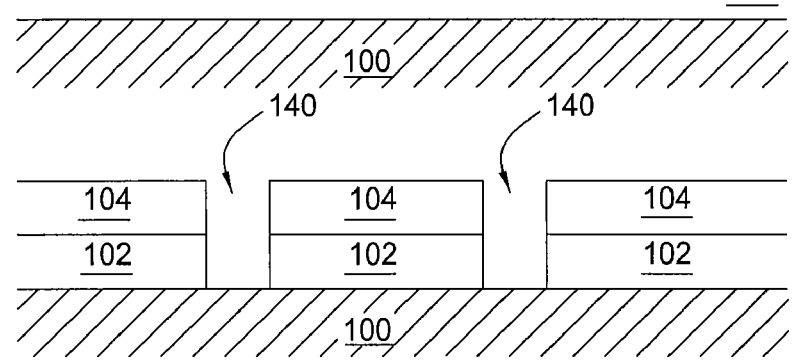
Figure 2:
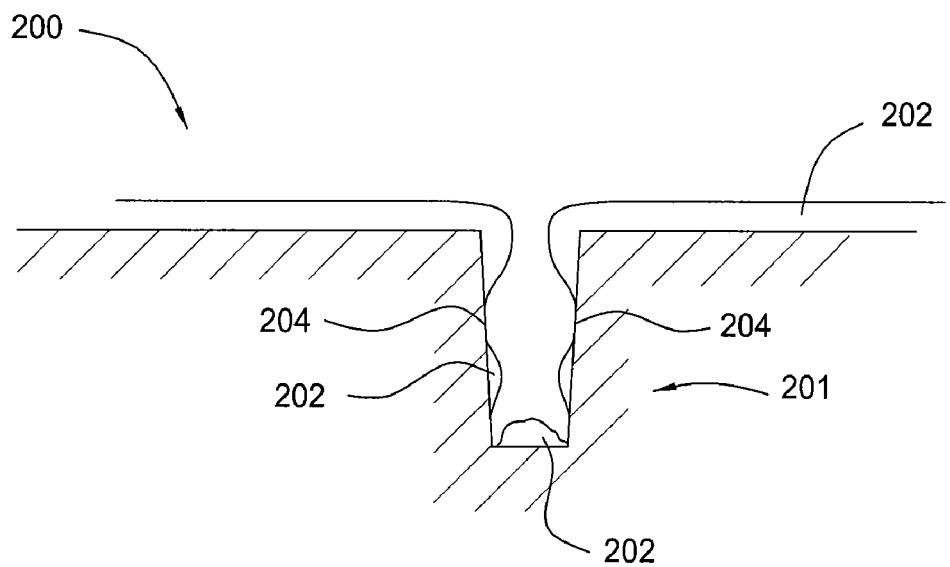
FIG. 2 (Prior Art) illustrates a schematic cross-sectional view of a substrate with a feature and a non-conformal amorphous carbon layer formed thereon.
Figure 9:
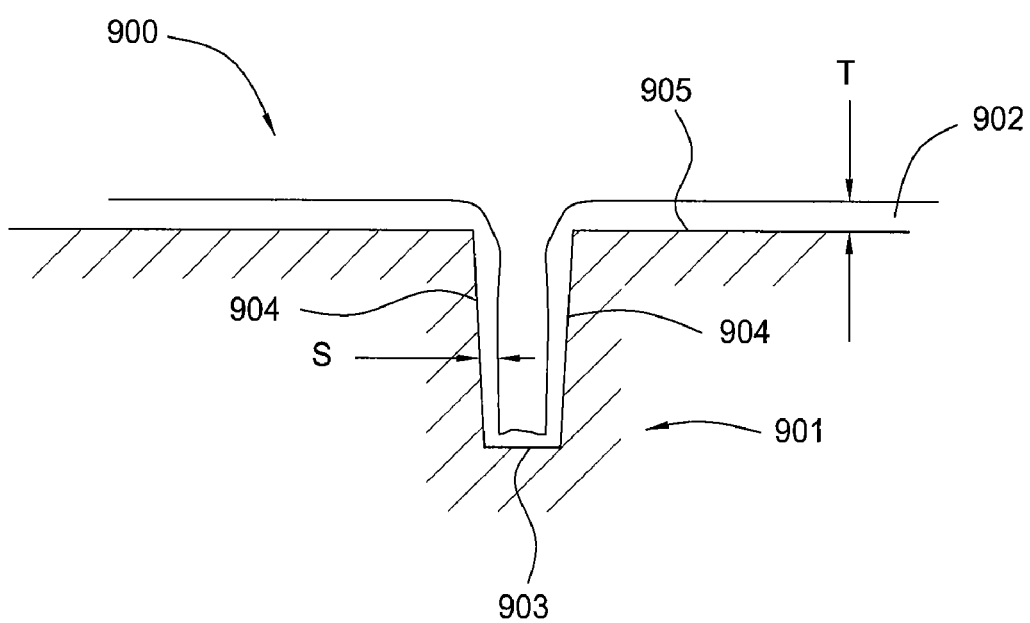
FIG. 9 illustrates a schematic cross-sectional view of a substrate with a feature and an amorphous carbon layer formed thereon.

Another major advantage of the inventive method is the enhancement of conformality over other a-C:H deposition processes, as illustrated in FIG. 9. FIG. 9 illustrates a schematic cross-sectional view of a substrate 900 with a feature 901 and an amorphous carbon layer 902 formed thereon. Amorphous carbon layer 902 illustrates the typical appearance of a film deposited using the inventive method. Qualitatively, amorphous carbon layer 902 is highly conformal and completely covers sidewalls 904 and floor 903 of feature 901. Quantitatively, amorphous carbon layer 902 may have a conformality on the order of about 20-30%, wherein conformality is defined as the ratio of the average thickness S of amorphous carbon layer 902 deposited on the sidewalls 904 to the average thickness T of amorphous carbon layer 902 on upper surface 905 of substrate 900. Referring back to FIG. 2, non-conformal amorphous carbon layer 202, which illustrates the general appearance of a film deposited with a hydrogen- or helium-diluted process, typically has a conformality of about 5%. A comparison of the deposition profiles of non-conformal amorphous carbon layer 202 in FIG. 2 and amorphous carbon layer 902 in FIG. 9 suggests that the trajectory of argon atoms is not as directional as hydrogen or helium ions. It may also be possible that the gas phase species present in the plasma are different with argon dilution compared to other diluents. These factors, in conjunction with the higher sticking probability of —$CH_x$ radicals on the substrate surface with an argon dilution process result in the improvement in conformality depicted in FIG. 9.

Lower Temperature Process

Another advantage of an argon-diluted process is that a lower temperature process may be used to produce an a-C:H layer with the desired density and transparency. Ordinarily, higher substrate temperature during deposition is the process parameter used to encourage the formation of a higher density film. Because the argon-diluted process already increases density for the reasons described above, substrate temperature may be reduced during deposition, for example to as low as about 300° C., and still produce a film of the desired density, i.e., from about 1.2 g/cc to about 1.8 g/cc. Hence, the argon-dilution process may produce a relatively high density film with an absorption coefficient as low as about 0.09. Further, lower processing temperatures are generally desirable for all substrates since this lowers the thermal budget of the process, protecting devices formed thereon from dopant migration Post-Deposition Termination Process for Particle Reduction During PECVD deposition of a-C:H films, nano-particles are generated in the bulk plasma due to gas phase polymerization of —$CH_x$ species. These particles naturally gain negative charge in the plasma and, thus, remain suspended in the plasma during deposition. However, when RF power is turned off and plasma is extinguished in the chamber, these particles tend to fall on the substrate surface due to gravity and viscous drag forces during pump-down. It is very important to ensure that these particles are flushed out of the chamber before the pump-down step. This can be accomplished by maintaining plasma in the chamber for a period of time after the film deposition has ended, i.e., after the flow of the hydrocarbon source has been stopped. The time for this termination step varies depending on the duration of the deposition process, since deposition time determines the size and number of particles generated during the deposition process. Longer deposition processes generally produce more and larger particles in the bulk plasma. The optimal duration of the post-deposition termination step is between about 5 seconds and about 20 seconds. It is also preferred that the plasma-maintaining gas is a light gas, such as helium or hydrogen, to minimize generation of particles by sputtering the showerhead. RF power is preferably reduced during the post-deposition termination step to a minimum level required to safely maintain a stable plasma and avoid arcing. A more energetic plasma is undesirable due to the deleterious effect it may have on the substrate, such as etching of the substrate surface, or sputtering of the shower head.

In addition, it has been found that $H_2$ doping of the plasma during the bulk deposition step and/or the post-deposition termination step further improves particle performance. Since a hydrogen atom may act as a terminating bond, it can passivate the gas phase species present in the plasma and prevent them from bonding with each other and growing into the unwanted nano-particles. Additionally, $H^+$ ions may reduce the size of extant nano-particles by chemically reacting with them and causing subsequent fragmentation. In so doing, the particles detected on substrates after a-C:H film deposition have been reduced by more than half for thinner a-C:H films, e.g., 7000 Å. For thicker a-C:H films, e.g., about 1 μm, the number of detected particles has been reduced by an order of magnitude with hydrogen doping. In a preferred aspect of the post-deposition termination step, the ratio of the molar flow rate of plasma-initiating gas to the molar flow rate of hydrogen gas is between about 1:1 and about 3:1. Higher flow rates of hydrogen during this process step are undesirable because higher concentrations of hydrogen in the chamber can adversely affect the deposited film. In the bulk deposition process, a preferred ratio of the molar flow rate of the diluent gas to the molar flow rate of the hydrogen gas is between about 2:1 and 4:1. Higher concentrations of hydrogen result in more aggressive particle reduction, but also may degrade the conformality of the a:C-H film.

In one example, a post-deposition termination step is used to reduce the number of particles contaminating the surface of 300 mm substrates when a 7000 Å thick a-C:H film is deposited thereon. After the deposition process, the flow of the hydrocarbon source, in this example 600 sccm of $C_3H_6$, is stopped. RF power is not terminated, however, and is instead reduced to the level required to maintain a stable plasma in the chamber. In this example, the RF power is reduced from about 1200 W to about 200-500 W. $H_2$ is introduced into the chamber in addition to the continued flow of plasma initiating gas, which in this example is helium. The flow rate of the hydrogen gas is about 1000-2000 sccm and the flow rate of helium is about 4000-6000 sccm. On average, the number of particles >0.12 μm that have been detected on the surface of a 300 mm substrate using the above post-deposition termination process is less than 15. In contrast, the number of particles >0.12 μm that have been detected on substrates when no post-deposition termination step is used is generally more than about 30.

While the foregoing is directed to embodiments of the present invention, other and further embodiments of the invention may be devised without departing from the basic scope thereof, and the scope thereof is determined by the claims that follow.

What is claimed is:

1. A method of forming an amorphous carbon layer on a substrate, comprising:

positioning a substrate in a substrate processing chamber;

introducing a hydrocarbon source into the processing chamber;

introducing a noble gas from the group consisting of argon, krypton, xenon, and combinations thereof into the processing chamber, wherein the molar flow rate of the noble gas is greater than the molar flow rate of the hydrocarbon source;

generating a plasma in the processing chamber;

forming an amorphous carbon layer on the substrate;

stopping the flow of the hydrocarbon source into the processing chamber while flowing a plasma-maintaining gas into the processing chamber to maintain a plasma therein; and introducing a hydrogen gas into the processing chamber with the plasma-maintaining gas after the stopping the flow of the hydrocarbon source into the processing chamber, wherein the ratio of the molar flow rate of the plasma-maintaining gas to the molar flow rate of the hydrogen gas is between about 1:1 to about 3:1.

2. The method of claim 1, wherein the molar flow rate of the noble gas is about 2 to 40 times greater than the molar flow rate of the hydrocarbon source.

3. The method of claim 2, wherein the noble gas is argon.

4. The method of claim 1, wherein the plasma-maintaining gas is helium and wherein the flowing the hydrogen gas and the flowing helium into the processing chamber continues for about 5 to 20 seconds after stopping the flow of the hydrocarbon source into the processing chamber.

5. The method of claim 1, wherein the hydrocarbon source is selected from the group consisting of aliphatic hydrocarbons, alicyclic hydrocarbons, aromatic hydrocarbons, and combinations thereof.

6. The method of claim 1, wherein the substrate processing chamber is a capacitively coupled plasma-enhanced CVD chamber.

7. The method of claim 6, wherein the pressure in the substrate processing chamber is about 2 Torr to 8 Torr during the process of forming an amorphous carbon layer on the substrate.

8. The method of claim 1, wherein the amorphous carbon layer is formed to have a density of about 1.2 g/cc to 1.8 g/cc and an absorption coefficient in the visible spectrum that is less than about 0.10.

9. The method of claim 8, further comprising heating the substrate to a temperature of no more than about 400° C. during the process of forming an amorphous carbon layer on the substrate.

10. The method of claim 1, wherein the hydrocarbon source is selected from the group consisting of ethylene, propylene, acetylene, and toluene.

11. A method of forming an amorphous carbon layer on a substrate, comprising:
  positioning a substrate in a substrate processing chamber;
  introducing a hydrocarbon source into the processing chamber;
  introducing a diluent gas for the hydrocarbon source into the processing chamber, wherein the molar flow rate of the diluent gas is about 2 to 40 times the molar flow rate of the hydrocarbon source;
  generating a plasma in the processing chamber;
  forming an amorphous carbon layer on the substrate;
  stopping the flow of the hydrocarbon source into the processing chamber while flowing the diluent gas into the processing chamber to maintain a plasma therein; and
  introducing a hydrogen gas into the processing chamber with the diluent gas after the stopping the flow of the hydrocarbon source into the processing chamber, wherein the ratio of the molar flow rate of the diluent gas to the molar flow rate of the hydrogen gas is between about 1:1 to about 3:1.

12. A method of forming an amorphous carbon layer on a substrate, comprising:
  positioning a substrate in a substrate processing chamber;
  introducing a hydrocarbon source into the processing chamber;
  introducing argon into the processing chamber as a diluent of the hydrocarbon source;
  generating a plasma in the processing chamber;
  maintaining a pressure of about 2 Torr to 8 Torr in the processing chamber after initiating plasma therein; and
  forming an amorphous carbon layer on the substrate;
  stopping the flow of the hydrocarbon source into the processing chamber while flowing argon into the processing chamber to maintain a plasma therein; and
  introducing a hydrogen gas into the processing chamber with the argon after the stopping the flow of the hydrocarbon source into the processing chamber, wherein the ratio of the molar flow rate of the argon to the molar flow rate of the hydrogen is about 1:1 to about 3:1.

13. The method of claim 12, wherein the molar flow rate of argon is about 2 to 40 times the molar flow rate of the hydrocarbon source.

14. The method of claim 13, wherein the amorphous carbon layer is formed to have a density of about 1.2 g/cc to 1.8 g/cc and an absorption coefficient in the visible spectrum no greater than about 0.10.

* * * * *

UNITED STATES PATENT AND TRADEMARK OFFICE
CERTIFICATE OF CORRECTION

PATENT NO. : 7,867,578 B2  
APPLICATION NO. : 11/427324  
DATED : January 11, 2011  
INVENTOR(S) : Padhi et al.

Page 1 of 1

It is certified that error appears in the above-identified patent and that said Letters Patent is hereby corrected as shown below:

Title Page; In the References Cited (56):

Please insert --PCT International Search Report for Application No. PCT/US07/71923 dated June 12, 2008.--.

Signed and Sealed this  
Fifth Day of April, 2011

David J. Kappos  
*Director of the United States Patent and Trademark Office*